United States Patent
Hidaka

(10) Patent No.: US 7,394,660 B2
(45) Date of Patent: Jul. 1, 2008

(54) ENCLOSURE STRUCTURE OF ELECTRONIC EQUIPMENT, AND DISK ARRAY APPARATUS

(75) Inventor: Hiroshi Hidaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 472 days.

(21) Appl. No.: 10/948,494

(22) Filed: Sep. 23, 2004

(65) Prior Publication Data

US 2005/0257232 A1    Nov. 17, 2005

(30) Foreign Application Priority Data

May 14, 2004    (JP) .............................. 2004-145299

(51) Int. Cl.
*H05K 5/00* (2006.01)
*H05K 7/16* (2006.01)

(52) U.S. Cl. ........................ 361/727; 361/724; 361/725; 361/726

(58) Field of Classification Search ................. 454/184; 211/41.12, 41.17, 49.1, 50, 51, 53, 58, 164–174; 361/695, 724–732
See application file for complete search history.

(56) References Cited

U.S. PATENT DOCUMENTS

| | | | | |
|---|---|---|---|---|
| 5,506,750 A | * | 4/1996 | Carteau et al. | 361/685 |
| 5,586,003 A | * | 12/1996 | Schmitt et al. | 361/683 |
| 6,392,892 B1 | * | 5/2002 | Sobolewski et al. | 361/724 |
| 6,754,082 B1 | * | 6/2004 | Ding et al. | 361/727 |
| 6,788,542 B2 | * | 9/2004 | Rumney | 361/724 |
| 6,922,336 B2 | * | 7/2005 | Barsun et al. | 361/683 |
| 7,038,915 B2 | * | 5/2006 | King et al. | 361/724 |
| 7,042,721 B2 | * | 5/2006 | Olesiewicz et al. | 361/695 |
| 2004/0255149 A1 | * | 12/2004 | Toyama et al. | 713/200 |
| 2005/0224689 A1 | * | 10/2005 | Tanaka et al. | 248/694 |

FOREIGN PATENT DOCUMENTS

| | | |
|---|---|---|
| GB | 2 272 792 | 5/1994 |
| JP | 6-215553 | 8/1994 |
| JP | 8-137631 | 5/1996 |
| JP | 2002-343075 | 11/2002 |
| JP | 2003-036669 | 2/2003 |

\* cited by examiner

*Primary Examiner*—Lisa Lea-Edmonds
*Assistant Examiner*—Anthony M Haughton
(74) *Attorney, Agent, or Firm*—Greer, Burns & Crain, Ltd.

(57) ABSTRACT

The invention relates to an enclosure structure of electronic equipment such as a rack-mount disk array apparatus, and its object is to increase the number of apparatus units to be mounted and facilitate replacement thereof. The enclosure structure of electronic equipment of the invention having an enclosure mounted in a rack in a withdrawable manner, is arranged such that it comprises a plurality of wiring panel portions that partition the inner space of the enclosure in the fore-and-aft direction, the plurality of wiring panel portion being disposed spanning over the inner surface portions of the enclosure; and a movable frame portion that rotationally moves apparatus units connected to the wiring panel portions together with the wiring panel portions, the movable frame portion providing a support to the apparatus units in such a manner as to be attachable to and detachable from the wiring panel portions.

8 Claims, 14 Drawing Sheets

ENCLOSURE STRUCTURE OF ELECTRONIC EQUIPMENT, AND DISK ARRAY APPARATUS

BACKGROUND OF THE INVENTION

1. Field of the Invention

The present invention relates to an enclosure structure of electronic equipment such as a rack-mount disk array apparatus.

2. Description of the Related Art

Reference is made to FIG. 1 to describe a conventional rack-mount disk array apparatus. In a disk array apparatus 2, there is provided a back panel 6 at the middle portion of an enclosure 4 mounted to the rack, with a plurality of hard disk units 8 provided on the front surface portion of the back panel 6 and a plurality of interface (I/F) units 10 and power supply units 12 provided on the rear surface portion of the back panel 6. The hard disk units 8 are mounted from the front surface side of the enclosure 4 for replacement thereof.

Japanese Patent Application Laid-Open Publication Nos. 2003-36669, 2002-343075, 08-137631 and 06-215553 are available as patent documents related to such an enclosure structure of electronic equipment such as such disk array apparatus.

In Japanese Patent Application Laid-Open Publication No. 2003-36669, there are disclosed electronic equipment and a rack housing the electronic equipment in which, for easy replacement of hard disk devices in a rack-housed server unit, the server unit is configured with outer and inner cases, with a movable portion capable of moving downward attached to the inner case and hard disk devices housed in two rows, and in which, in the case of replacement of hard disk devices located toward the back, the inner case is drawn out, and further the movable portion is lowered so as to expose the end surfaces of the hard disk devices located toward the back. In such a configuration, all hard disk devices can be replaced from the front surface side, with no need to detach the server unit from the rack at the time of replacement.

In Japanese Patent Application Laid-Open Publication No. 2002-343075, there is disclosed a disk array that allows easy performance of tasks such as replacement and addition of hard disk units and prevents occurrence of shorting failure as a result of contact between signal cable and slim enclosure. In this disk array, a plurality of slim enclosures, each equipped with a hard disk unit, are housed in a rack so as to be slidable, with the slim enclosures provided with a tray having a front opening for allowing entry of the hard disk unit so as to be freely attachable/detachable and a connector for connecting the hard disk unit that has entered from the front opening. The tray is supported so as to be movable to the disk attachment/detachment position that brings the front opening away from the bottom plate of the slim enclosure and to the use position that brings the front opening close to the bottom plate.

In Japanese Patent Application Laid-Open Publication No. 08-137631, there is disclosed a disk array apparatus in which 2.5-inch or smaller hard disks can be installed using the form factor of 5.25-inch or 3.5-inch hard disk of a conventional disk array apparatus. As its configuration, four 2.5-inch hard disks are arranged three-dimensionally in a slot corresponding with the form factor of 5.25-inch hard disk of disk array apparatus. In the event of a failure of a hard disk, one pulls out the slot by grabbing the handle at the front of the slot, pulls out the faulty hard disk by grabbing the handle located toward the front, replaces the faulty hard disk with a new one, inserts the new hard disk into the slot by reversing the procedure for withdrawal and puts the slot back into the disk array apparatus to complete hot-swap.

In Japanese Patent Application Laid-Open Publication No. 06-215553, there is disclosed an easy-to-install-and-detach disk drive carrier assembly that is equipped with a 3.5-inch disk head assembly (HDA) and an electronic card pack in a detachable manner.

Incidentally, description will be given of hard disk units mounted in such a disk array apparatus with reference to FIGS. 2A and 2B. FIG. 2A shows a case in which 3.5-inch hard disk (HDD) units are mounted in a rack, whereas FIG. 2B shows a case in which 2.5-inch hard disk-units are mounted in the same rack. In these disk array apparatuses 2, size reduction of hard disk units 8, mounted in the enclosure 4, for example, from 3.5-inch type to 2.5-inch type, will result in a reduced storage capacity per unit height of the rack if the same unit arrangement is used as in the conventional apparatus.

In a disk array apparatus 2A shown in FIG. 2A, the size of the 3.5-inch hard disk units 8 mounted in a rack 14 is 3U, thus making the height 36U due to a 12-stage configuration. Here, 1U=44.45 mm (1.75 inches) based on EIA standard. Letting the number of the hard disk units 8 installed in the direction of width of the rack 14 be 15, the storage capacity of each of the hard disk units 8 be, for example, 300 GB, and the storage capacity per the rack 14 in this case be $M_1$, then the storage capacity $M_1$ is:

$$M_1 = 12 \times 15 \times 300 \text{ [GB]} = 54,000 \text{ [GB]}$$

In this case, the storage capacity per 1U or $M_1/36U$ is:

$$M_1/36U = 54,000 \text{ [GB]}/36U = 1,500 \text{ [GB]}$$

In contrast, in a disk array apparatus 2B shown in FIG. 2B, the size of 2.5-inch hard disk units 18 mounted in a rack 16 is 2U, thus making the height 36U similarly due to an 18-stage configuration. Letting the number of the hard disk units 18 installed in the direction of width of the rack 16 be 24, the storage capacity of each of the hard disk units 18 be, for example, 73 GB, and the storage capacity per the rack 16 in this case be $M_2$, then the storage capacity $M_2$ is:

$$M_2 = 18 \times 24 \times 73 \text{ [GB]} = 31,536 \text{ [GB]}$$

In this case, the storage capacity per 1U or $M_2/36U$ is:

$$M_2/36U = 31,536 \text{ [GB]}/36U = 876 \text{ [GB]}$$

Thus, if the 3.5-inch hard disk units 8 are changed to the 2.5-inch hard disk units 18, the storage capacity per the rack 16 is low, despite increased number of the hard disk units 18, because the storage capacity of each of the hard disk units 18 is low, thus resulting in 50 percent reduction in storage capacity per 1U. In addition, unless the storage capacity of the 2.5-inch hard disk units 18 increases, it is impossible to complement the decrease in storage capacity by increased number of units alone when the 3.5-inch hard disk units 8 are changed to the 2.5-inch hard disk units 18. It is therefore necessary for the disk array apparatus 2B to implement a structure that allows mounting of additional hard disk units in the apparatus and replacement thereof.

With regard to such a problem, there is no disclosure in Japanese Patent Application Laid-Open Publication Nos. 2003-36669, 2002-343075, 08-137631 and 06-215553, nor is there any description of means for solving the problem.

SUMMARY OF THE INVENTION

The present invention relates to an enclosure structure of electronic equipment such as a rack-mount disk array apparatus, and it is an object of the present invention to increase the number of apparatus units to be mounted and facilitate replacement thereof.

It is another object of the present invention to provide a disk array apparatus that allows increased number of hard disk units to be mounted and that facilitates replacement thereof.

In order to achieve the above objects, according to a first aspect of the present invention there is provided an enclosure structure of electronic equipment having an enclosure mounted in a rack in a withdrawable manner, the enclosure structure comprising a plurality of wiring panel portions that partition the inner space of the enclosure in the fore-and-aft direction, the plurality of wiring panel portion being disposed spanning over the inner surface portions of the enclosure; and a movable frame portion that rotationally moves apparatus units connected to the wiring panel portions together with the wiring panel portions, the movable frame portion providing a support to the apparatus units in such a manner as to be attachable to and detachable from the wiring panel portions.

This enclosure structure of electronic equipment is applied to various types of electronic equipment such as a disk array apparatus, having an enclosure mounted in a rack in a withdrawable manner. Apparatus units to be mounted in the enclosure are connected to wiring panel portions. The wiring panel portions are provided in the fore-and-aft direction, spanning over inner surface portions of the enclosure, with the enclosure partitioned in the fore-and-aft direction by the plurality of wiring panel portions. Apparatus units are mounted in a partitioned space portion. In the enclosure provided with the plurality of wiring panel portions, apparatus units are mounted in each wiring panel portion, with the apparatus units in the fore-and-aft direction installed spanning over the wiring panel portions. There is provided, for this reason, a movable frame portion for facilitating attachment/detachment of the apparatus units on the back side when there are provided the apparatus units on the front side. The movable frame portion moves the apparatus units connected to the wiring panel portions rotationally together with their wiring panel portions, thus allowing for attachment/detachment of the apparatus units to/from the wiring panel portions and easy replacement of the apparatus units through the attachment/detachment. And, by applying such an enclosure structure to, for example, the disk array apparatus, it is possible to enhance the mounting density of hard disk units serving as the apparatus units, thus boosting the storage capacity and facilitating replacement thereof.

In the enclosure structure of electronic equipment, a rotational motion mechanism may further be provided that supports the movable frame portion on the enclosure in such a manner as to be rotationally movable, the rotational motion mechanism rotationally moving the movable frame portion by a given angle. By virtue of such a configuration, it is possible to attach/detach the apparatus units with the movable frame portion moved rotationally.

In the enclosure structure of electronic equipment, the rotational motion mechanism may include a supporting shaft supporting the movable frame portion on the enclosure in such a manner as to be rotationally movable; a gear mechanism intervening between the supporting shaft and the enclosure; and a spring intervening between the enclosure and the movable frame portion, the spring imparting a force of rotational motion derived from a restoration force to between the movable frame portion and the enclosure.

In such a configuration, the movable frame portion, supported on the enclosure by a supporting shaft, is rotationally movable via a gear mechanism provided between the movable frame portion and the enclosure. Additionally, the restoration force of the spring acts in the spreading direction. For this reason, the movable frame portion rotates by receiving the restoration force of the spring via the gear mechanism, thus making it possible to extract the apparatus units from the enclosure. In this case, the gear mechanism eases, through gear ratio, the rotational force resulting from the restoration force of the spring, thus cushioning the impact of rotation of the movable frame portion on the apparatus units.

In the enclosure structure of electronic equipment, a fixing mechanism may further be provided that fixes the movable frame portion to the enclosure against the restoration force of the spring. By virtue of such a configuration, rotation of the movable frame portion is blocked by the fixing mechanism, thus allowing the movable frame portion to be stably held within the enclosure.

In the enclosure structure of electronic equipment, the fixing mechanism may include a locking portion disposed in the movable frame portion, the locking portion blocking rotational motion by becoming caught on a member of the enclosure; and an expansion/contraction portion permitting rotational motion of the movable frame portion by unlocking the locking portion.

In order to achieve the above objects, according to a second aspect of the present invention there is provided a disk array apparatus comprising an enclosure mounted in a rack in such a manner as to be withdrawable; a plurality of wiring panel portions disposed within the enclosure; and hard disk units connected to the wiring panel portions, the hard disk units being disposed in a plurality of stages in the direction of height of the enclosure, in a plurality of rows in the direction of width of the enclosure, and in a plurality of columns in the fore-and-aft direction of the enclosure.

In such a configuration, the plurality of wiring panel portions are provided in the enclosure mounted in a rack in a withdrawable manner, with the space in the enclosure being partitioned. In the partitioned space, there are provided a plurality of hard disk units, a plurality of stages in the direction of height of the enclosure, a plurality of rows in the direction of width of the enclosure and a plurality of columns in the fore-and-aft direction of the enclosure. This therefore boosts the number of hard disk units mounted within the rack, thus complementing decrease in storage capacity by increased number of hard disk units mounted even if hard disk units with low storage capacity are installed and thereby achieving the desired storage capacity.

In order to achieve the above objects, according to a third aspect of the present invention there is provided a disk array apparatus mounted with hard disk units in an enclosure disposed in a rack in such a manner as to be withdrawable, the disk array apparatus comprising a plurality of wiring panel portions that partition the inner space of the enclosure in the fore-and-aft direction, the plurality of wiring panel portions being disposed spanning over the inner surface portions of the enclosure; and a movable frame portion that rotationally moves hard disk units connected to the wiring panel portions together with the wiring panel portions, the movable frame portion providing a support to the hard disk units in such a manner as to be attachable to and detachable from the wiring panel portions.

In this disk array apparatus, similar to the above enclosure structure, a rotational motion mechanism may further be provided that supports the movable frame portion on the enclosure in such a manner as to be rotationally movable, the rotational motion mechanism rotationally moving the movable frame portion by a given angle. A sliding mechanism may further be provided that enables the enclosure to be withdrawn from the rack. The rotational motion mechanism may include a supporting shaft supporting the movable frame portion on the enclosure in such a manner as to be rotationally movable; a gear mechanism intervening between the supporting shaft and the enclosure; and a spring intervening between the enclosure and the movable frame portion, the spring imparting a force of rotational motion derived from a restoration force to between the movable frame portion and the enclosure.

In the disk array apparatus, a fixing mechanism may further be provided that fixes the movable frame portion to the enclosure against the restoration force of the spring. The fixing mechanism may include a locking portion disposed in the movable frame portion, the locking portion blocking rotational motion by becoming caught on a member of the enclosure; and an expansion/contraction portion permitting rotational motion of the movable frame portion by unlocking the locking portion.

As described above, the present invention relating to an enclosure structure of electronic equipment such as disk array apparatus is advantageous in that it boosts the number of apparatus units mounted and facilitates attachment/detachment and replacement thereof and that it is applicable to a variety of equipment using enclosures and racks.

According to the enclosure structure of electronic equipment of the present invention, therefore, it is possible to boost the number of apparatus units mounted and facilitate replacement thereof.

According to the disk array apparatus of the present invention, on the other hand, it is possible to not only enhance the storage capacity by boosting the number of hard disk units mounted but also facilitate replacement thereof.

BRIEF DESCRIPTION OF THE DRAWINGS

Other objects, features and advantages of the present invention will become more apparent from the following description of embodiments when taken in conjunction with the accompanying drawings, in which.

DETAILED DESCRIPTION OF THE PREFERRED EMBODIMENTS

Figure 3:
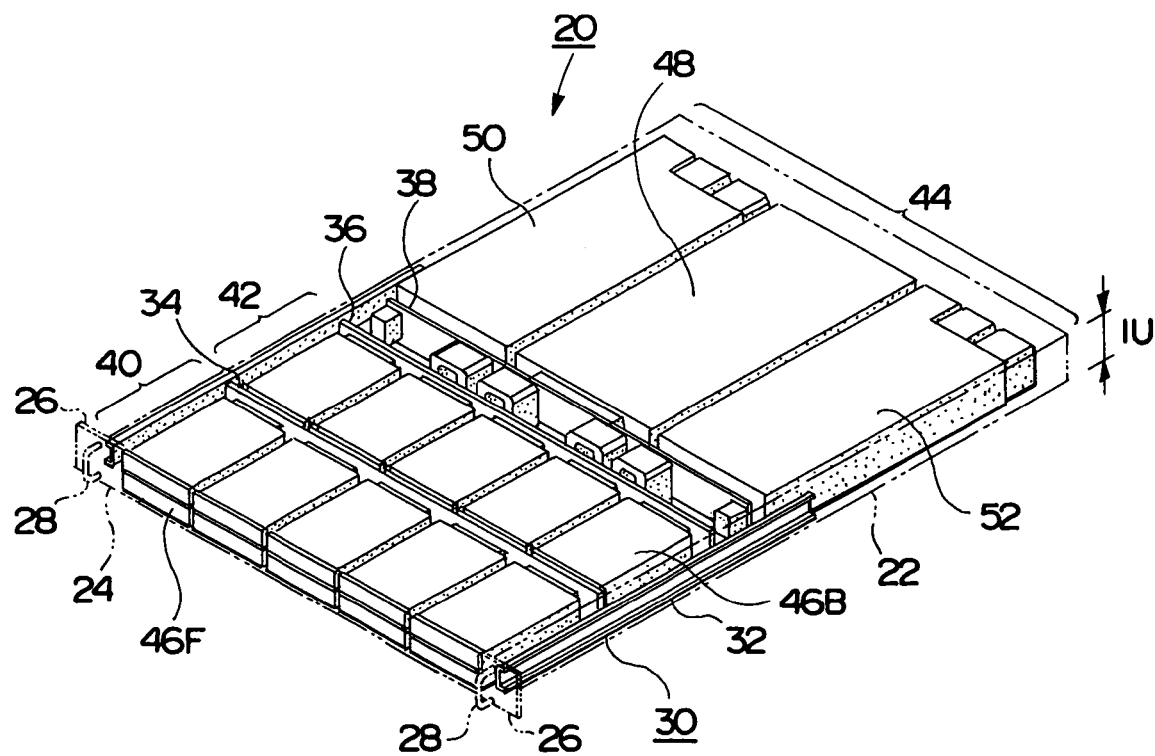
FIG. 3 is a perspective view showing the enclosure mounted in a disk array apparatus according to an embodiment of the present invention.

An embodiment of the present invention will now be described. The present embodiment discloses, as an embodiment of an enclosure structure of electronic equipment, a disk array apparatus. Description will be given of the disk array apparatus with reference to FIG. 3. FIG. 3 is a perspective view showing a configuration within the enclosure of the disk array apparatus.

In a disk array apparatus 20, an enclosure 22 is a flat container in the form of a rectangular parallelepiped made of a rigid material such as metal or synthetic resin, with the height h being set to, for example, 1U (44.5 [mm]) in EIA standard. On the front surface portion of the enclosure 22, there is provided an opening portion 24, with U-shaped handles 28 attached to flange portions 26 provided on the left and right of the opening portion 24. On the side surface portions of the enclosure 22, there is attached a slide rail 32 for a sliding mechanism 30.

Inside the enclosure 22, there are provided a plurality of back panels 34, 36 and 38 as wiring panel portions spanning between the side surface portions, with the inner space of the enclosure 22 partitioned by the three back panels 34, 36 and 38. On the front side of the back panels 34 and 36, there are provided unit installation portions 40 and 42 for the hard disk units, whereas on the back side of the back panel 38, there is provided a unit installation portion 44 for other equipment. In the present embodiment, the back panels 34 and 36 on the front side are, for example, provided with a spacing corresponding with the 2.5-inch hard disk unit. In the unit installation portion 40, there are provided 10 hard disk units 46F, two vertically and five horizontally. Similarly in the unit installation portion 42, there are provided 10 hard disk units 46B, two vertically and five horizontally. In this case, the number of the hard disk units 46F and 46B provided in the single enclosure 22 is 20 units. In the unit installation portion 44, on the other hand, there are provided interface (I/F) units 48 and 49 vertically at the center portion, with power supply units 50 and 52 provided to sandwich the I/F units 48 and 49.

Figure 4:
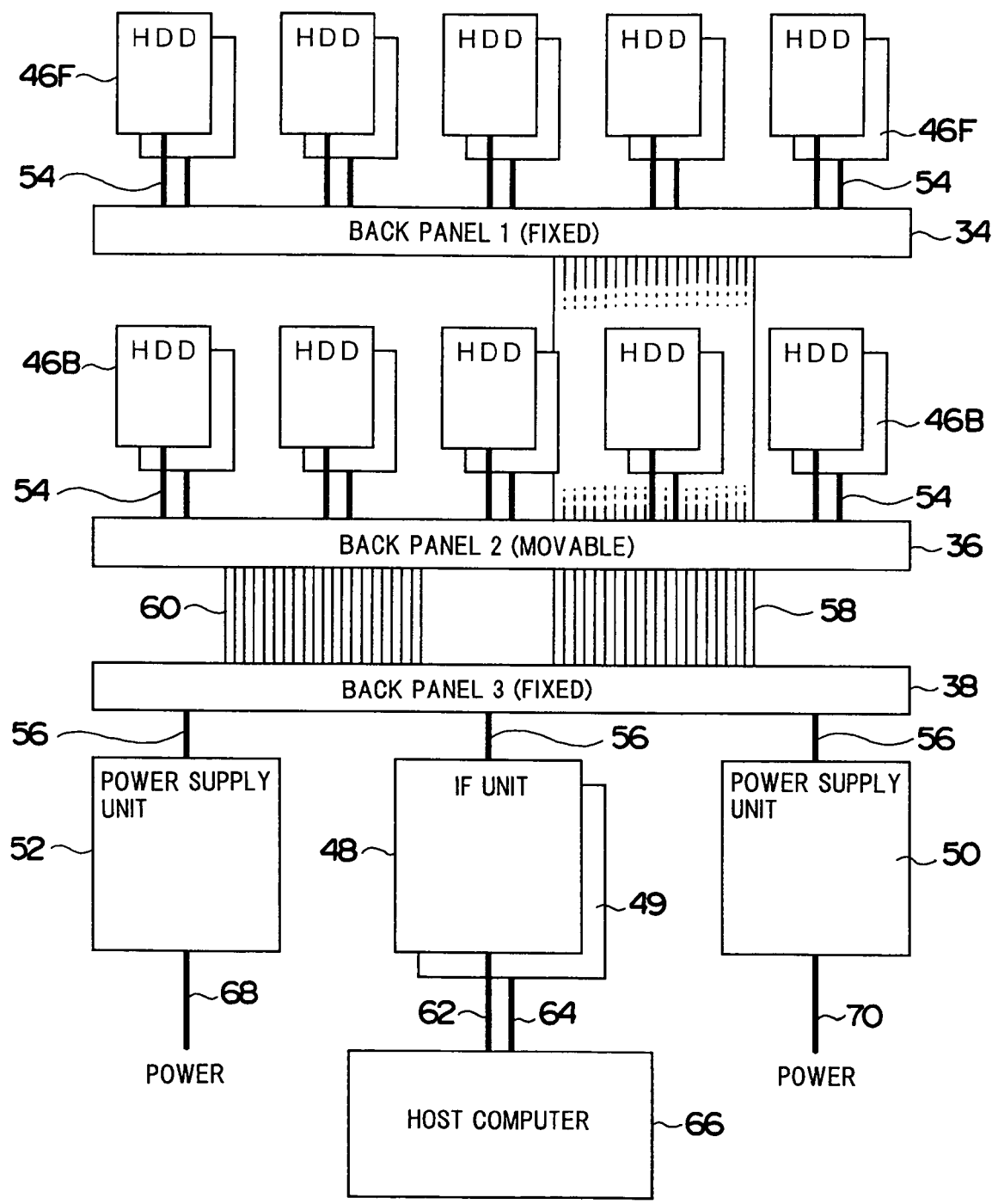
FIG. 4 is a block diagram showing a configuration of the disk array apparatus in which the enclosure serves as a unit.

Description will be given next of a configuration of the disk array apparatus 20 with reference to FIG. 4. FIG. 4 shows the configuration of the disk array apparatus 20 configured in the enclosure 22.

The hard disk units 46F on the front side are connected to the back panel 34 by connectors 54, whereas the hard disk units 46B on the back side are connected to the back panel 36 by connectors 54. On the other hand, the I/F units 48 and 49 and the power supply units 50 and 52 are each connected to the back panel 38 by connectors 56. There is connected to the back panel 38, the back panel 34 via a first flat cable 58 and the back panel 36 via a second flat cable 60. Each of the flat cables 58 and 60 is provided along the bottom surface of the enclosure 22.

On the other hand, there is connected to the I/F units 48 and 49, a host computer 66 through external input/output cables 62 and 64, respectively. Therefore, the I/F unit 48 mediates between the hard disk units 46F on the front side and the host computer 66 and takes charge of delivery and reception of data, whereas the I/F unit 49 mediates between the hard disk units 46B on the back side and the host computer 66 and takes charge of delivery and reception of data. Each of the power supply units 50 and 52 is individually supplied with power externally through external input/output cables 68 and 70.

In such a configuration, the power supply unit 50 takes charge of supplying power to the hard disk units 46F on the front side, whereas the power supply unit 52 takes charge of supplying power to the hard disk units 46B on the back side. Therefore, the hard disk units 46F on the front side are supplied with I/F signal and power through the flat cable 58, whereas the hard disk units 46B on the back side are supplied with I/F signal and power through the flat cable 60.

Figure 5:
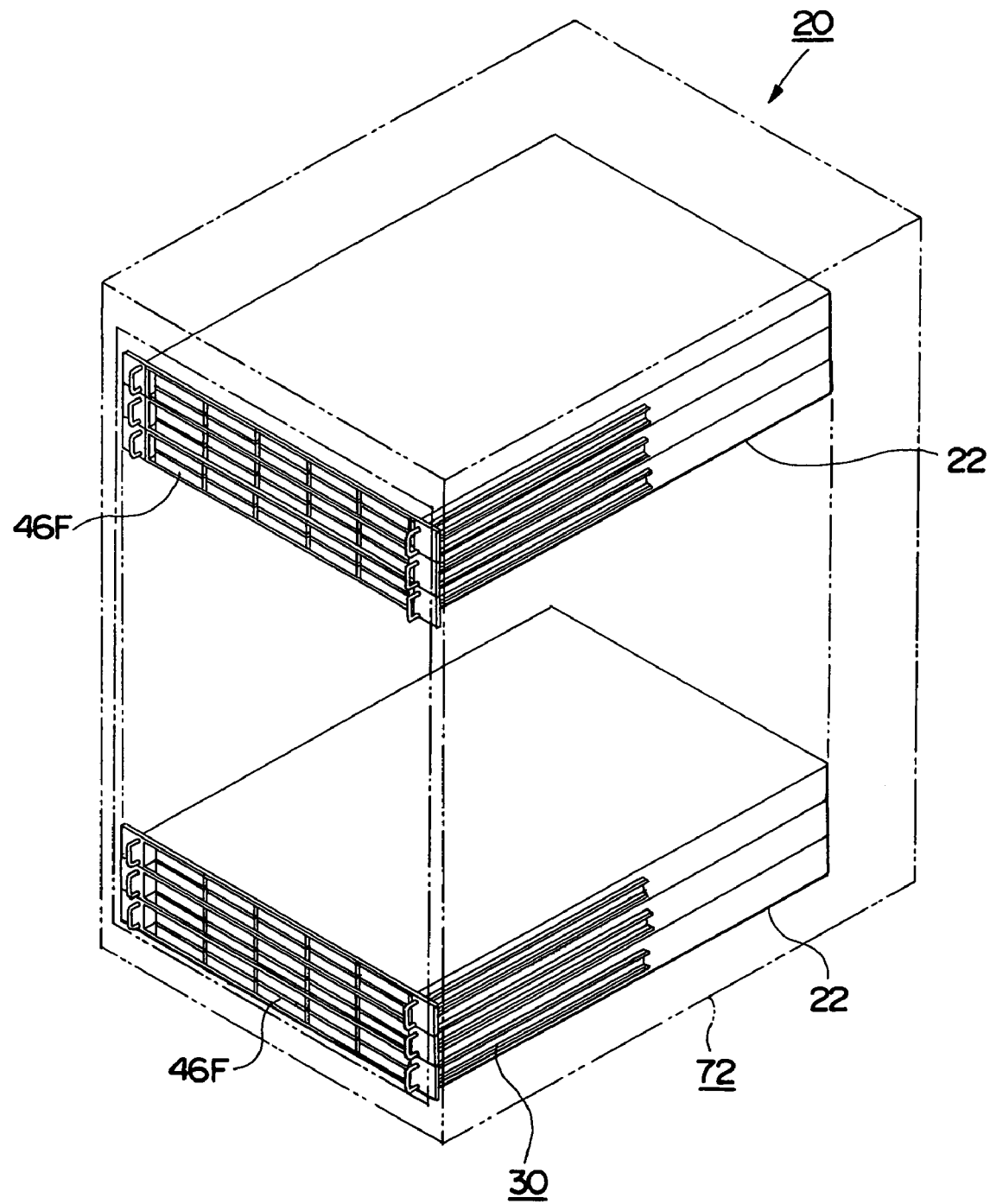
FIG. 5 is a perspective view showing the disk array apparatus mounting the enclosure of 1U.

Description will be given next of rack mounting of the enclosures 22 with reference to FIG. 5. FIG. 5 shows rack mounting of the enclosures 22.

This rack 72 is 36U in height, allowing for the 36 enclosures 22 as stated above to be attached. In each of the enclosures 22, there are mounted the hard disk units 46F, 46B and so on shown in FIG. 3.

When the hard disk units 46F and 46B shown in FIG. 3 are provided in the enclosures 22, letting the storage capacity of each of the hard disk units 46F and 46B be 73 GB and the total number of the hard disk units 46F and 46B mounted in each of the enclosures 22 be 20, then the total storage capacity $M_3$ is:

$$M_3 = 20 \times 73 \text{ [GB]} \times 36 = 52,560 \text{ [GB]}$$

In this case, the storage capacity per 1U or $M_3/36$ is:

$$M_3/36 = 20 \times 73 \text{ [GB]} = 1,460 \text{ [GB]}$$

Figure 1:
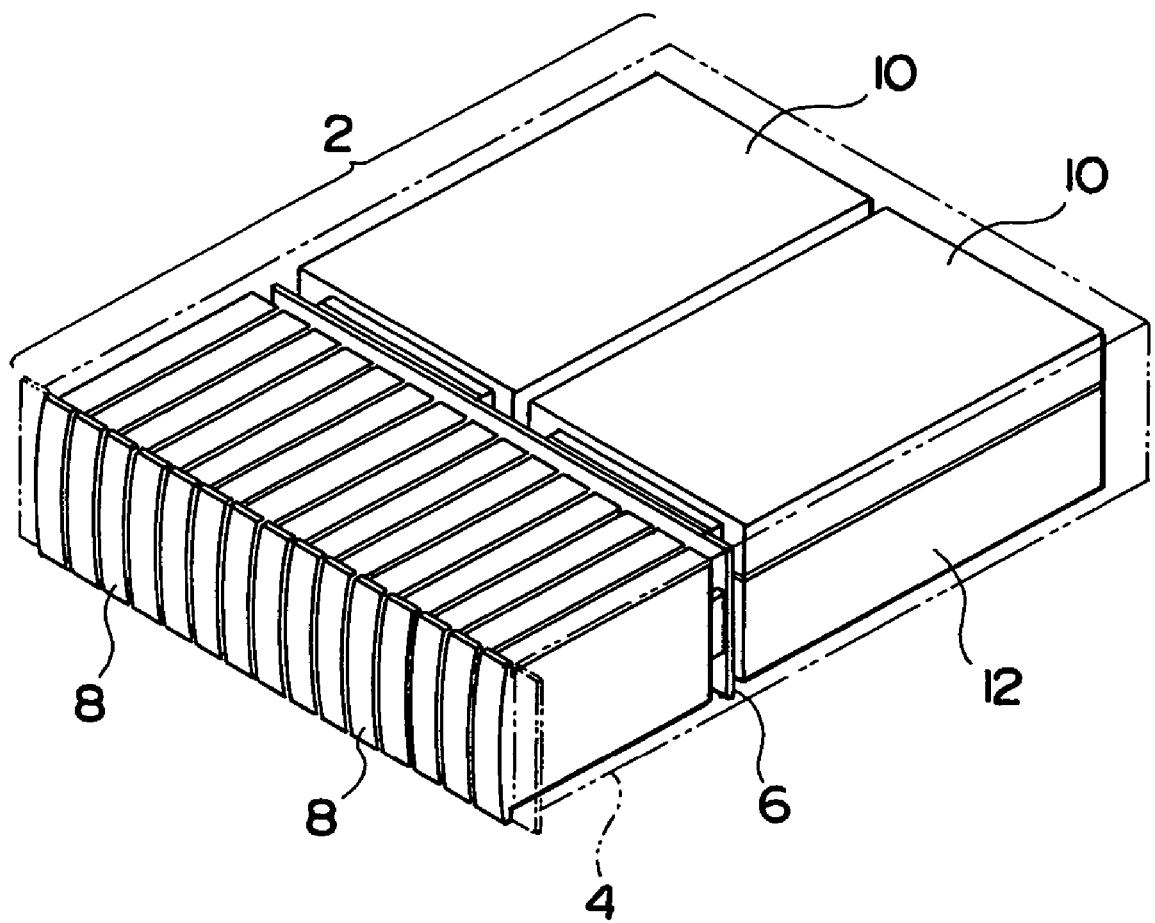
FIG. 1 is a perspective view showing an enclosure mounted in a conventional disk array apparatus.
Figure 2A:
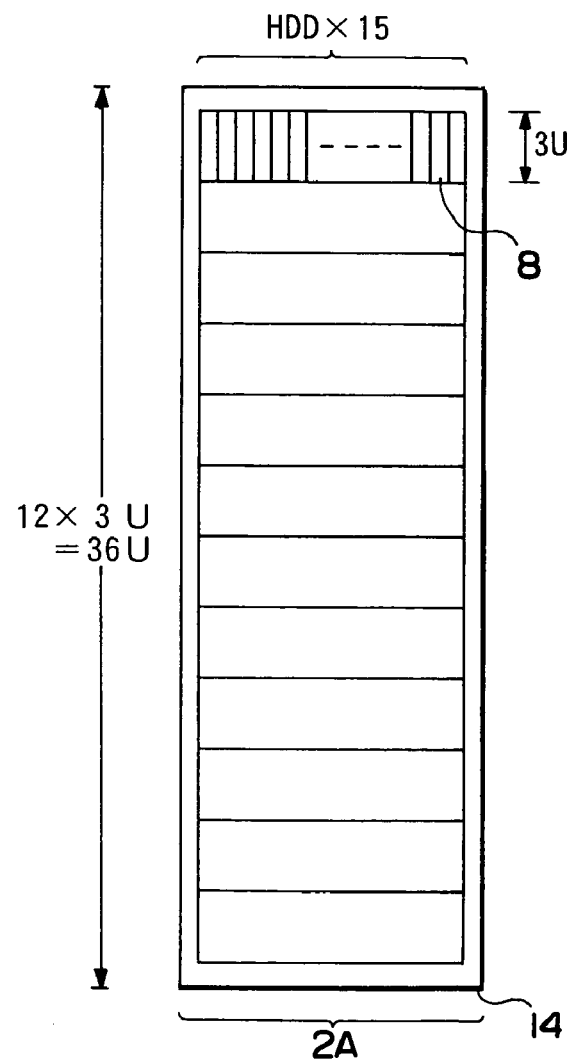
FIGS. 2A and 2B show disk array apparatuses for comparison of storage capacity of hard disk units mounted in conventional racks, with FIG. 2A being a view showing a disk array apparatus equipped with 3.5-inch hard disk units, and FIG. 2B being a view showing a disk array apparatus equipped with 2.5-inch hard disk units.
Figure 2B:
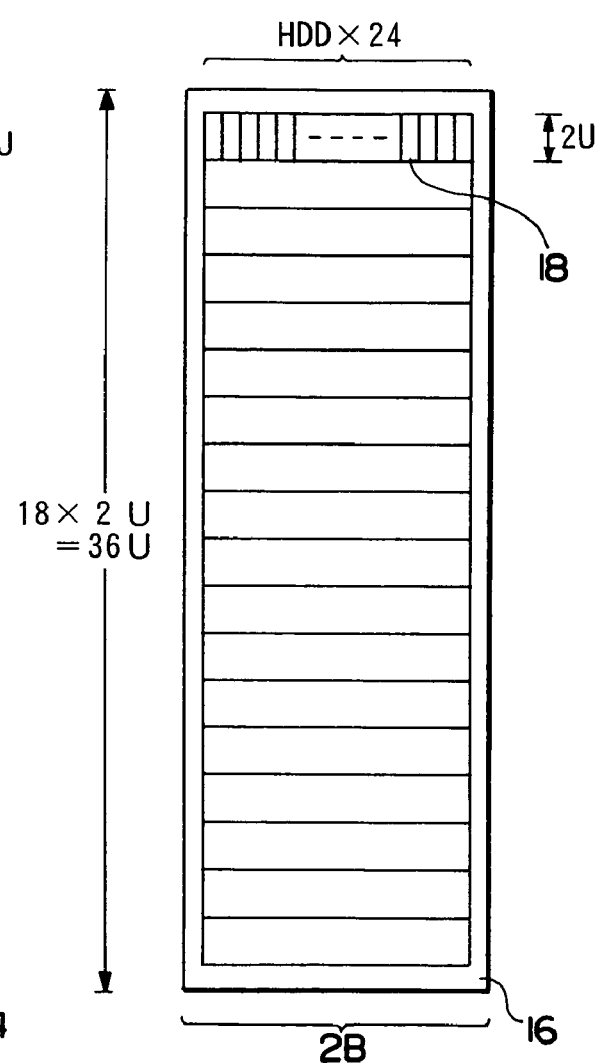

Hence, by using the 2.5-inch hard disk units 46F and 46F, it is possible to achieve a value similar to in the case that the 3.5-inch hard disk units 8 (FIG. 2) are used.

Figure 6:
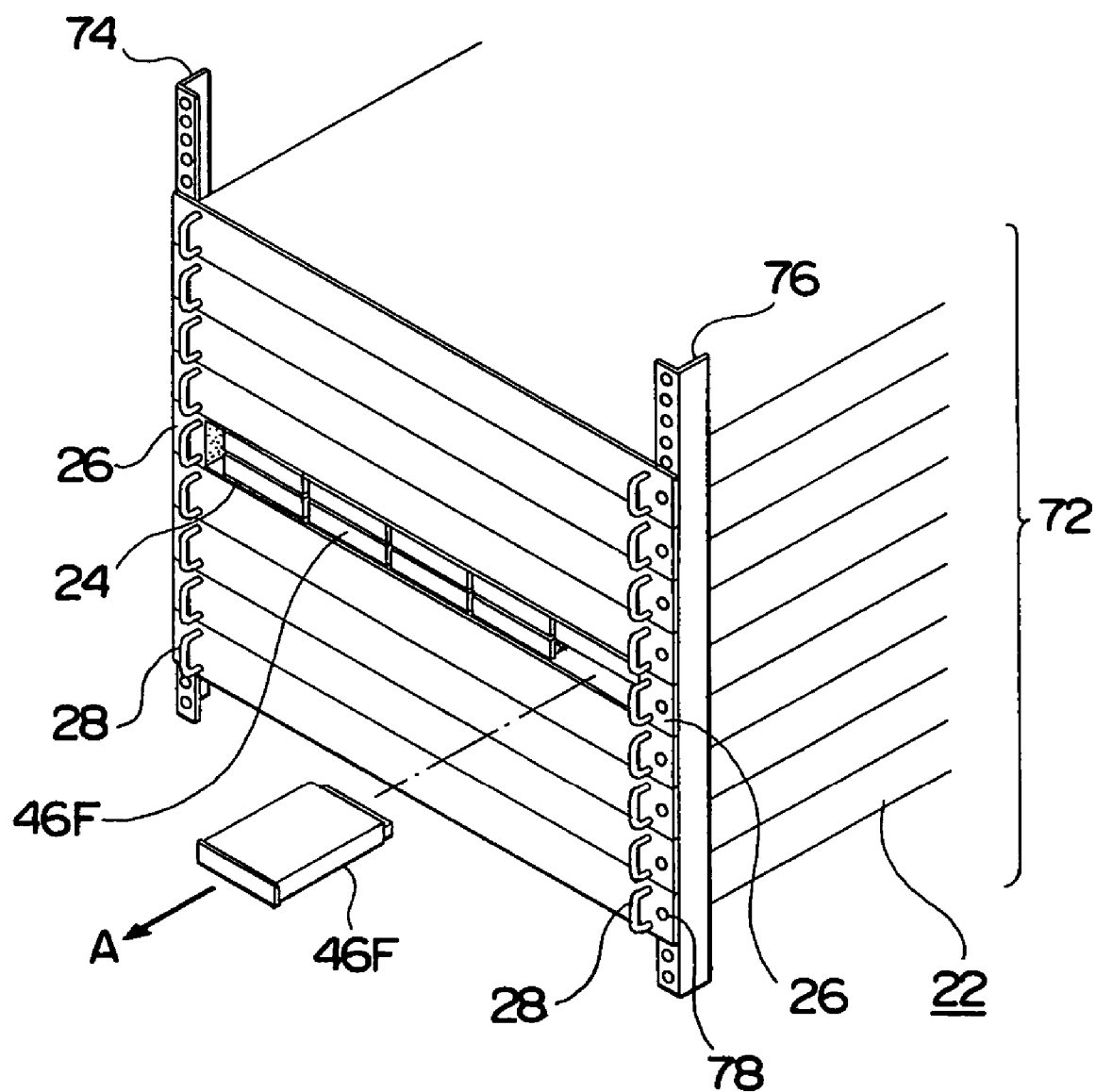
FIG. 6 is a perspective view showing extraction of the hard disk unit from the enclosure mounted in the rack.

Description will be given next of extraction of the hard disk units 46F on the side of the back panel 34 with reference to FIG. 6. FIG. 6 shows extraction of the hard disk unit 46F from the enclosure 22 on the rack 72.

On the front side of the rack 72, there are set up posts 74 and 76 for supporting the enclosures 22, with the flange portions 26 of the enclosures 22 attached to each of the posts 74 and 76 by locking screws 78 so as to be attachable and detachable. On the front surface portion of each of the enclosures 22, there is formed the opening portion 24, thus allowing for extraction of the hard disk units 46F on the front side from the opening portion 24 in the direction of an arrow A and replacement thereof.

Figure 7:
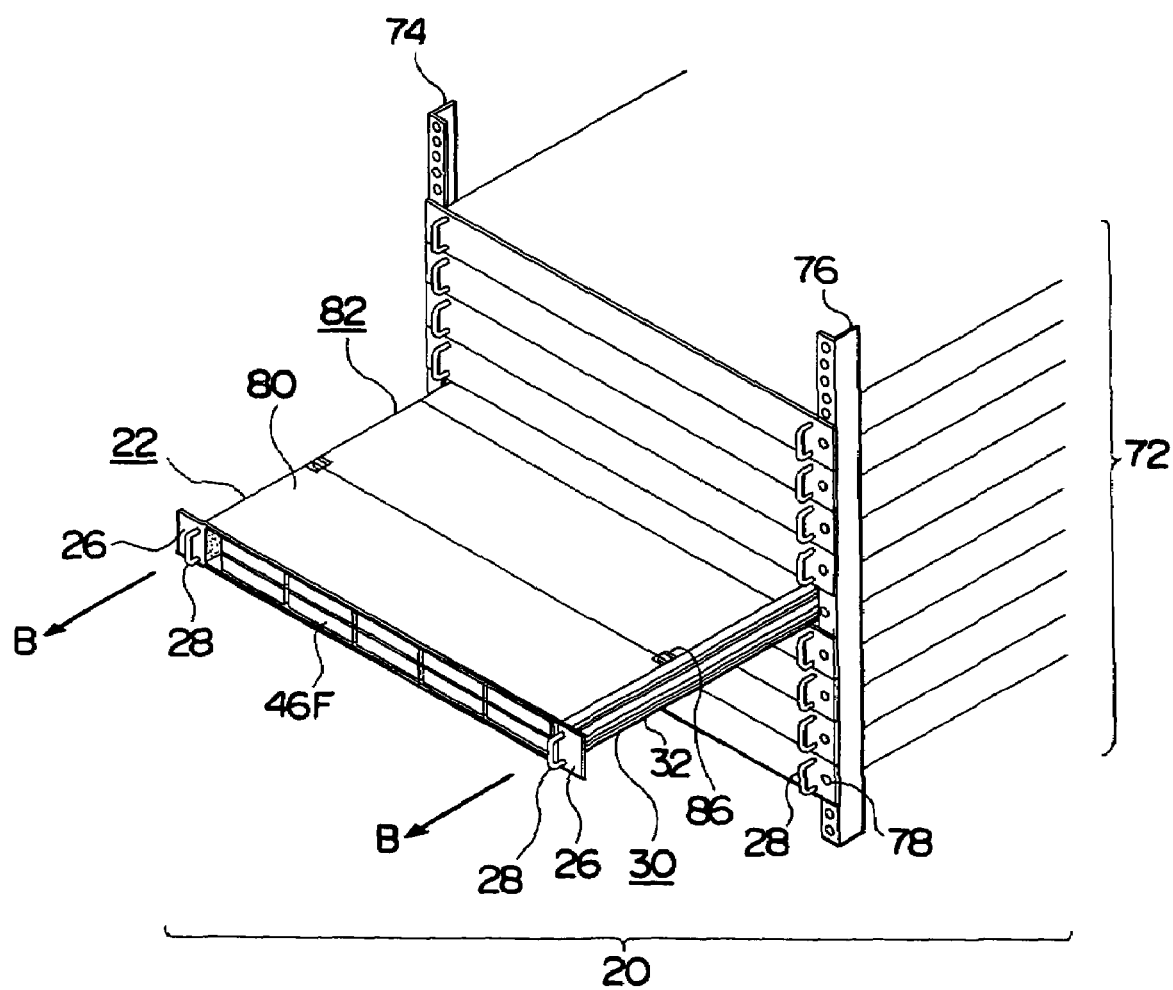
FIG. 7 is a perspective view showing extraction of the enclosure from the rack.
Figure 8:
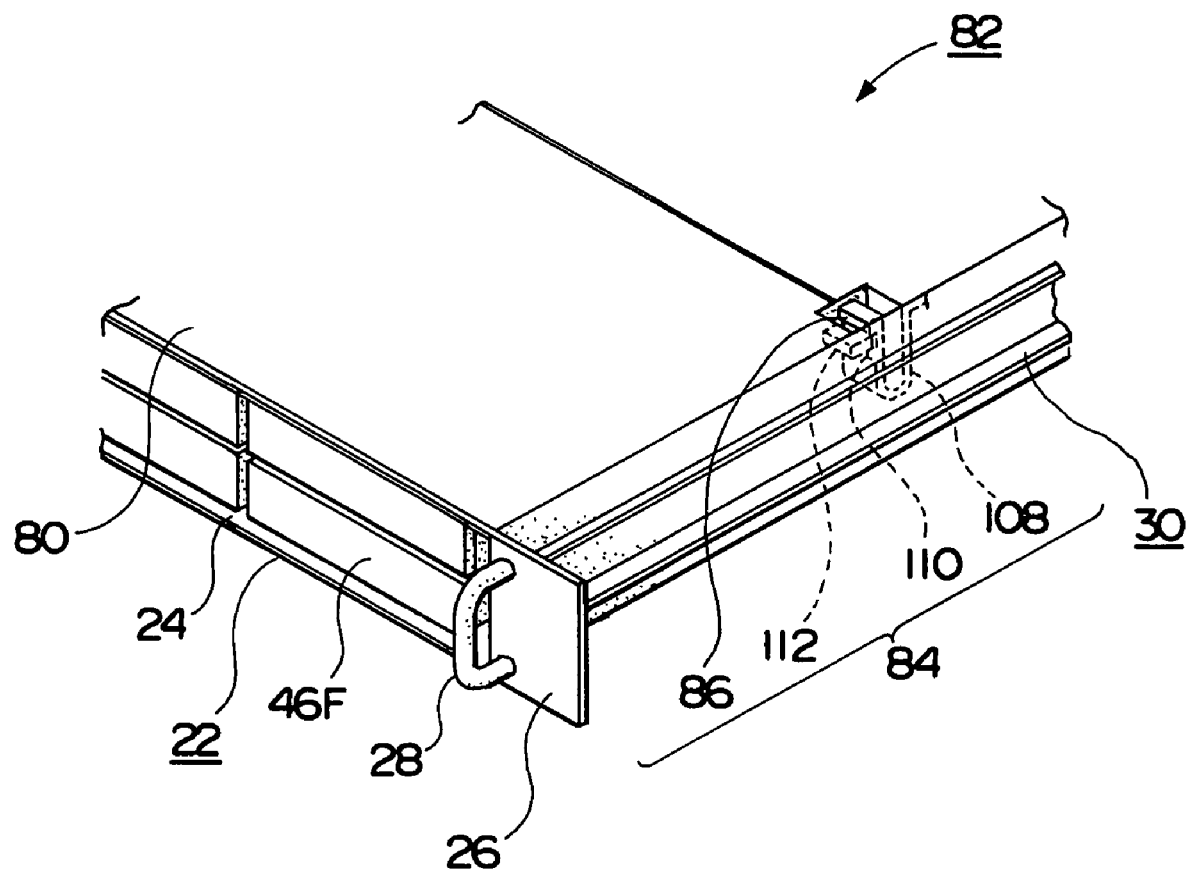
FIG. 8 is a perspective view showing the outline of a fixing mechanism of a movable frame portion.

Description will be given next of extraction of the enclosures 22 with reference to FIGS. 7 and 8. FIG. 7 shows the enclosure 22 as extracted from the rack 72, whereas FIG. 8 shows the fixing mechanism of the movable frame portion.

The enclosures 22 mounted in the rack 72 are supported on the rack 72 by the slide rail 32 of the sliding mechanism 30 so as to be freely slidable, thus allowing the enclosures 22 to be pulled out toward front (in the direction of an arrow B) of the rack 72 by removing the locking screws 78.

On the top portion of the enclosures 22, there are provided a cover portion 80 for covering the hard disk units 46F on the front side and a movable frame portion 82 for mounting the hard disk units 46B on the back side. The movable frame portion 82 is configured, as mentioned later, so that it can open/close during attachment/detachment and replacement of the hard disk units 46B on the back side, and there is attached to the movable frame portion 82, an operation unit 86 for operating a fixing mechanism 84 (FIG. 8). Through operations of the operation unit 86, the movable frame portion 82 is detached from the enclosure 22, thus opening the movable frame portion 82.

Figure 9:
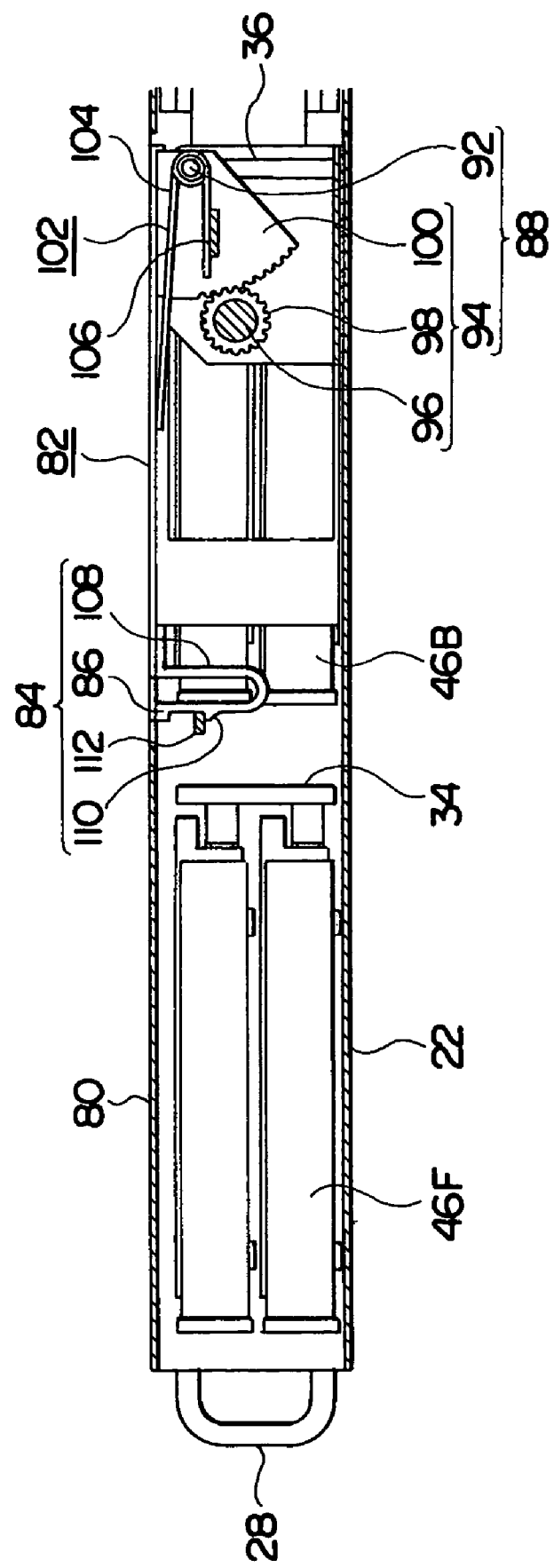
FIG. 9 is a partial sectional view showing part of the enclosure shown with the movable frame portion closed.
Figure 10:
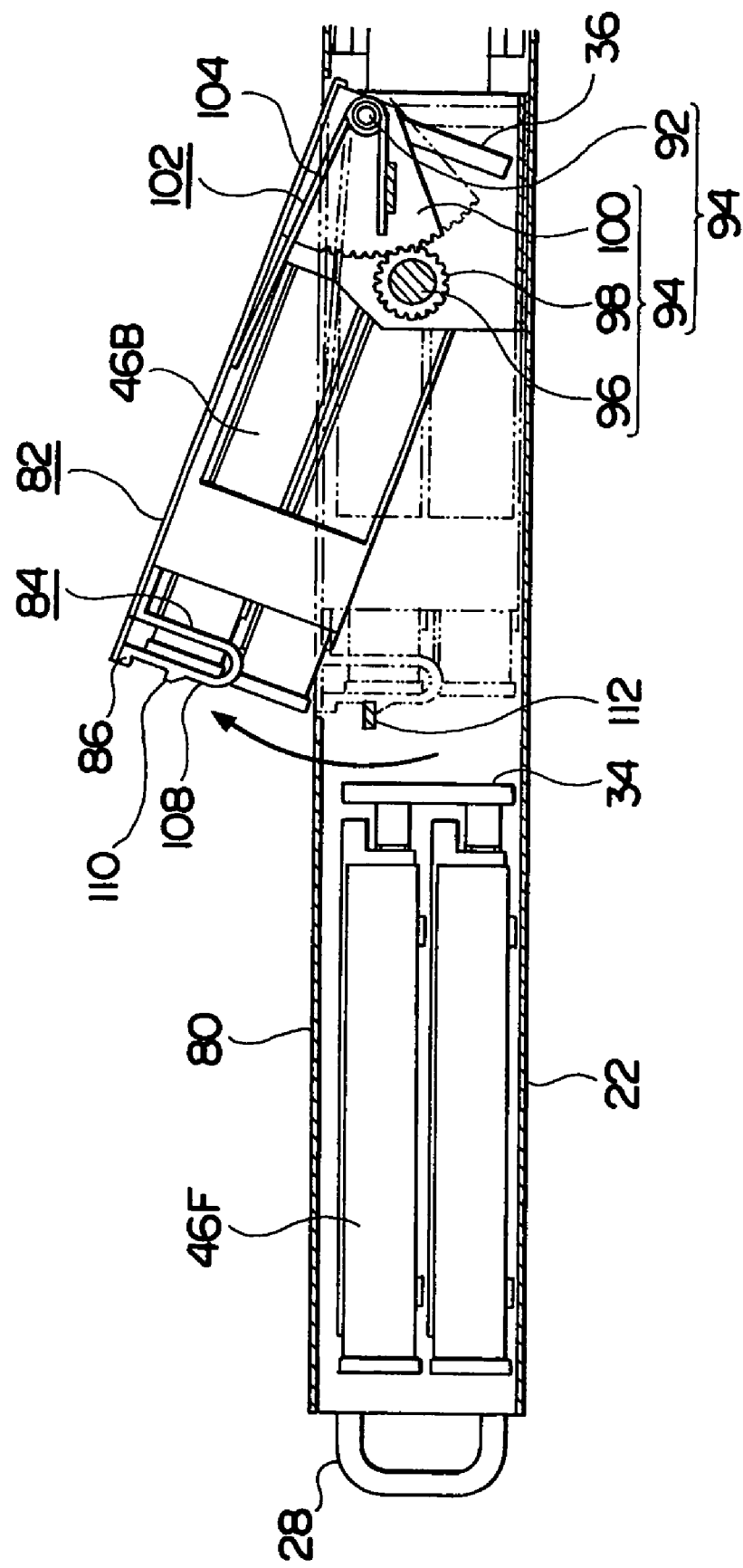
FIG. 10 is a partial sectional view showing part of the enclosure shown with the movable frame portion open.
Figure 11:
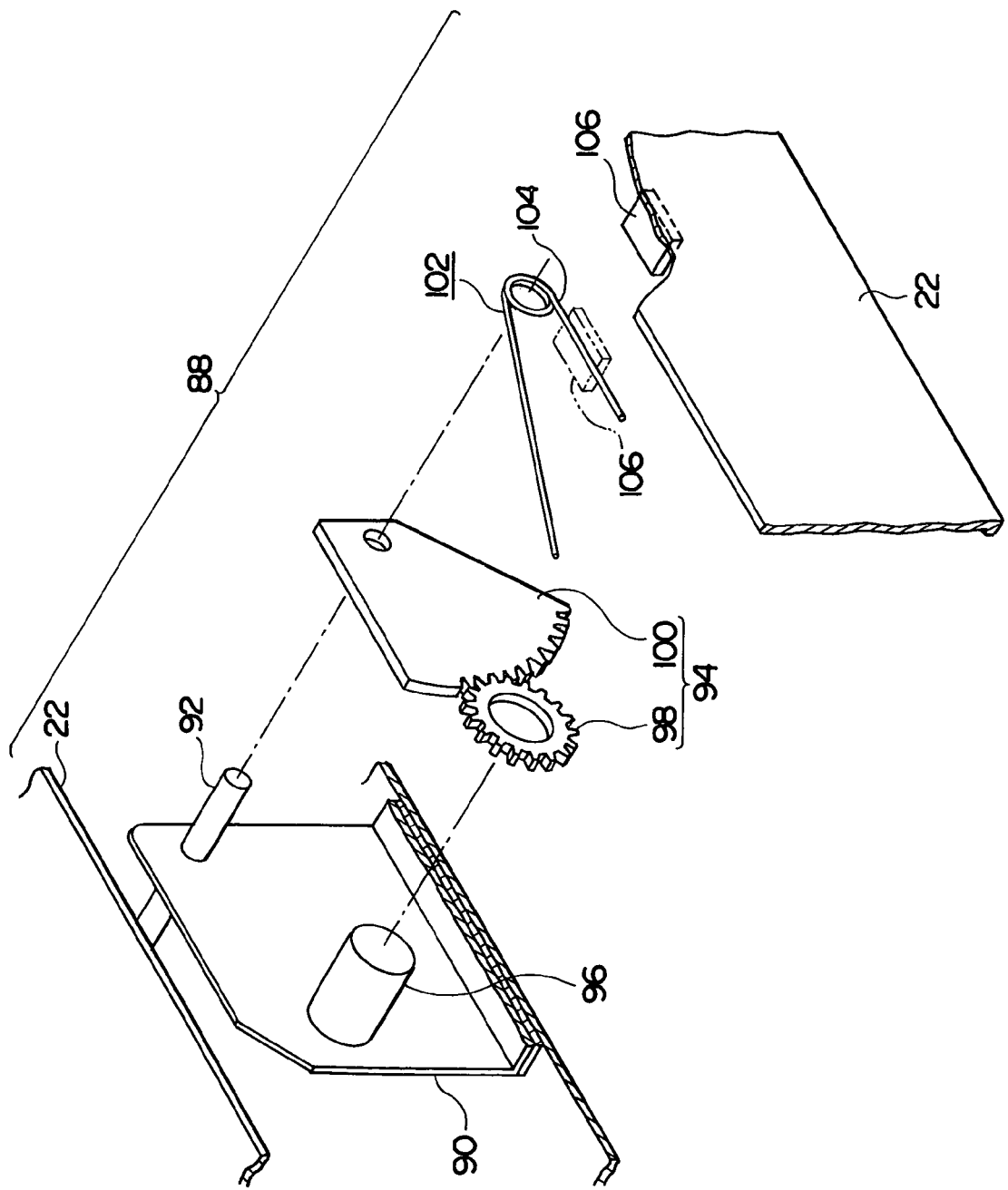
FIG. 11 is an exploded perspective view showing an open/close mechanism.
Figure 12:
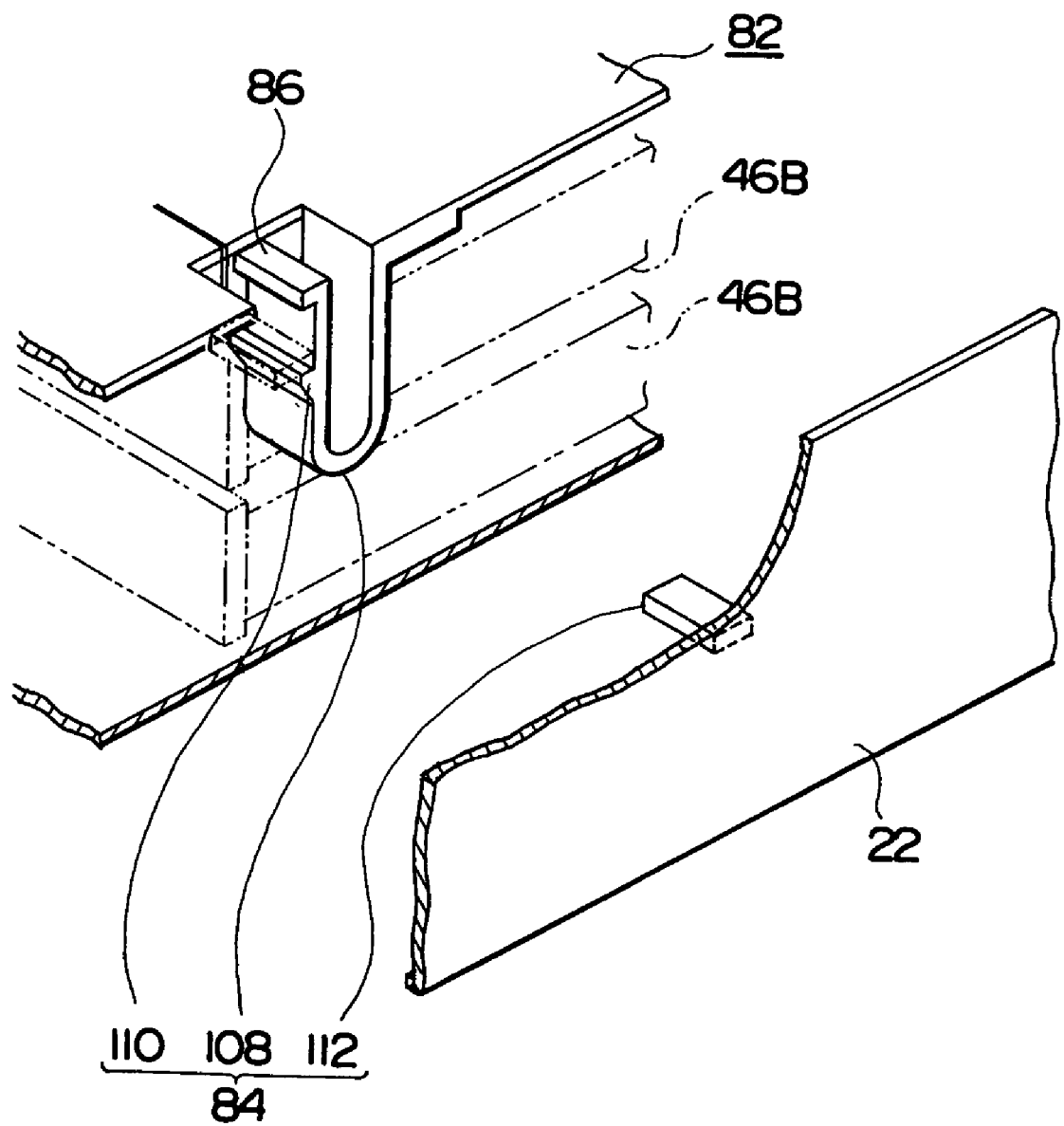
FIG. 12 is an exploded perspective view showing the fixing mechanism that is partially cut out.

Description will be given next of a rotational motion mechanism and the fixing mechanism 84 of the movable frame portion 82 with reference to FIGS. 9 to 12. FIG. 9 is a view showing the movable frame portion 82 as closed, FIG. 10 is a view showing the movable frame portion 82 as open, FIG. 11 is an exploded perspective view showing the rotational motion mechanism, and FIG. 12 is an exploded perspective view showing the fixing mechanism 84.

On the side surface portions of the enclosure 22, there is provided a rotational motion mechanism 88 that supports the movable frame portion 82 so as to be rotationally movable. That is, there are set up a pair of bearing plates 90 as supporting members, with the movable frame portion 82 supported on the bearing plate 90 via a rotation supporting shaft 92 so as to be rotationally movable. The rotation supporting shaft 92 is attached to the upper corner portion on the back side of the movable frame portion 82. In the movable frame portion 82, there are mounted the hard disk units 46B on the back side and the back panel 36 described earlier. A gear mechanism 94 mediates between the bearing plate 90 and the movable frame portion 82, and the gear mechanism 94 is made up of a rotationally movable first gear 98 attached to a supporting shaft 96 of the bearing plate 90 and a fan-shaped second gear 100 attached to the movable frame portion 82 using the rotation supporting shaft 92 as the rotation center, with the gears 98 and 100 meshing with each other. The second gear 100 is larger in diameter than the first gear 98, restricting the open/close range and rotational motion angle of the movable frame portion 82.

In the gear mechanism 94, there are provided a spring mechanism 102 as a mechanism for imparting a force in the opening direction to the movable frame portion 82 and a coil spring 104 wound around the rotation supporting shaft 92, with one end thereof supported by the side of the movable frame portion 82 and the other end supported by a fixed portion 106 protruding from the enclosure 22. In the condition shown in FIG. 9, the coil spring 104 is in a compressed state, with its restoration force acting between the gear 100 of the movable frame portion 82 and the enclosure 22.

On both side portions on the front of the movable frame portion 82, there is provided the already-described fixing mechanism 84, and in the present embodiment, there are provided a U-shaped expansion/contraction portion 108 formed with a spring material and having the front end side that is a free end, a claw portion 110 as a locking portion protruded from the middle portion of the expansion/contraction portion 108 and the operation unit 86 for stretching or shrinking the expansion/contraction portion 108. In the enclosure 22, there is provided a catching portion 112 for engagement with the claw portion 110. When the claw portion 110 is locked to the catching portion 112, the movable frame portion 82 is fixed and restricted within the enclosure 22, and when the claw portion 110 is unlocked from the catching portion 112 as a result of stretching or shrinkage of the expansion/contraction portion 108, the movable frame portion 82 moves rotationally to become open through the action of the restoration force of the coil spring 104, as shown in FIG. 10.

Figure 13:
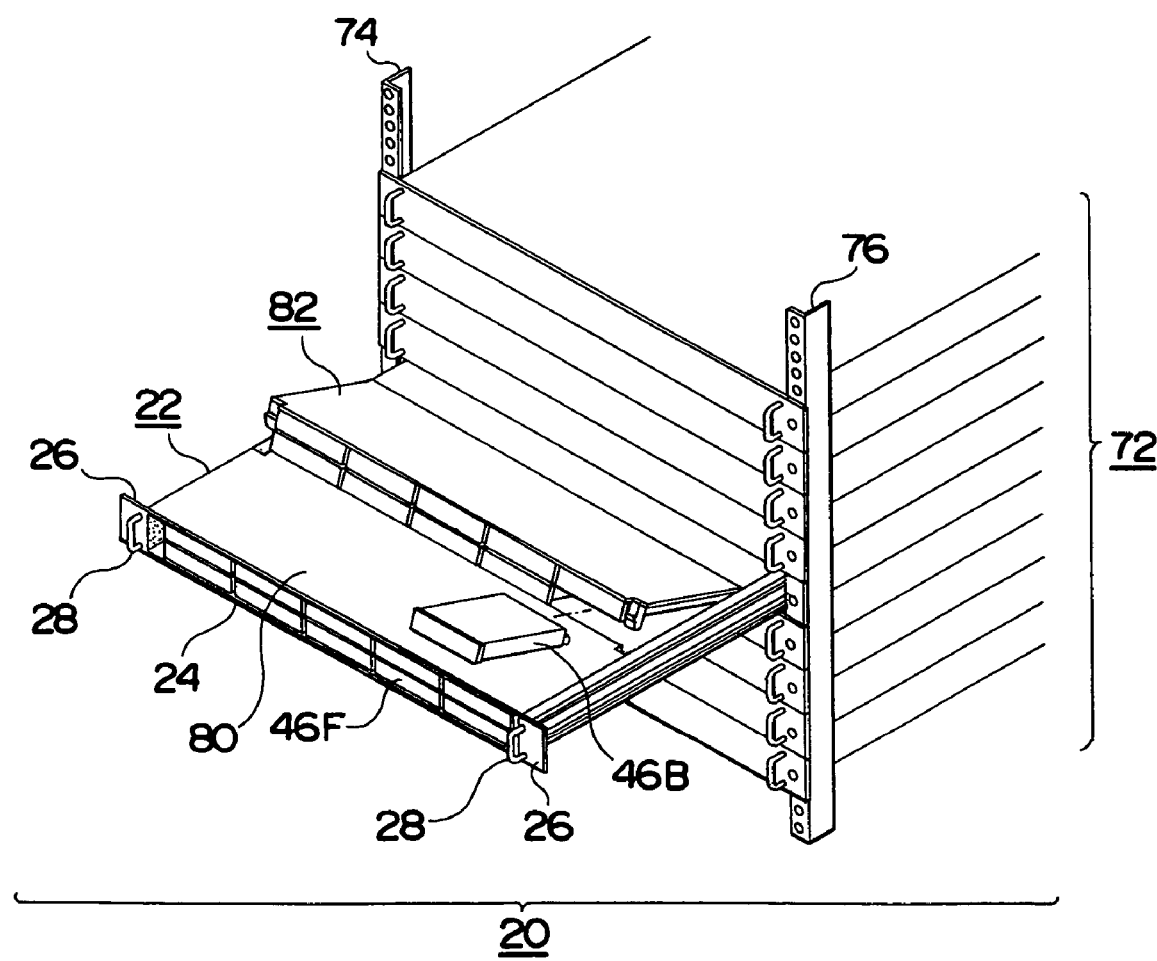
FIG. 13 is a perspective view showing extraction of the hard disk unit on the side of the movable frame portion.

In such a configuration, as the enclosure 22 is pulled out from the rack 72 and the claw portion 110 is unlocked from the catching portion 112 through operation of the operation unit 86 of the fixing mechanism 84, the movable frame portion 82 moves rotationally under the restoration force of the coil spring 104 centering around the rotation supporting shaft 92 and becomes upwardly open from the cover portion 80 covering the hard disk units 46F on the front side, as shown in FIG. 13. In this condition, the hard disk units 46B are extracted from the movable frame portion 82, allowing for easy replacement thereof.

Although a considerably large restoration force from the coil spring 104 acts on the side of the movable frame portion 82 at the time of rotational motion of the movable frame portion 82, a reaction force acts to counter the restoration force due to meshing of the gears 98 and 100 and a gear ratio of the two gears, thus alleviating the force of rotational motion of the movable frame portion 82. This renders the rotational motion of the movable frame portion 82 gentle, thus alleviating the impact on the hard disk units 46B mounted in the movable frame portion 82. At the same time, the impact is alleviated on the enclosure 22. It is possible therefore to protect the hard disk units 46B and others from damage due to the impact.

Figure 14:
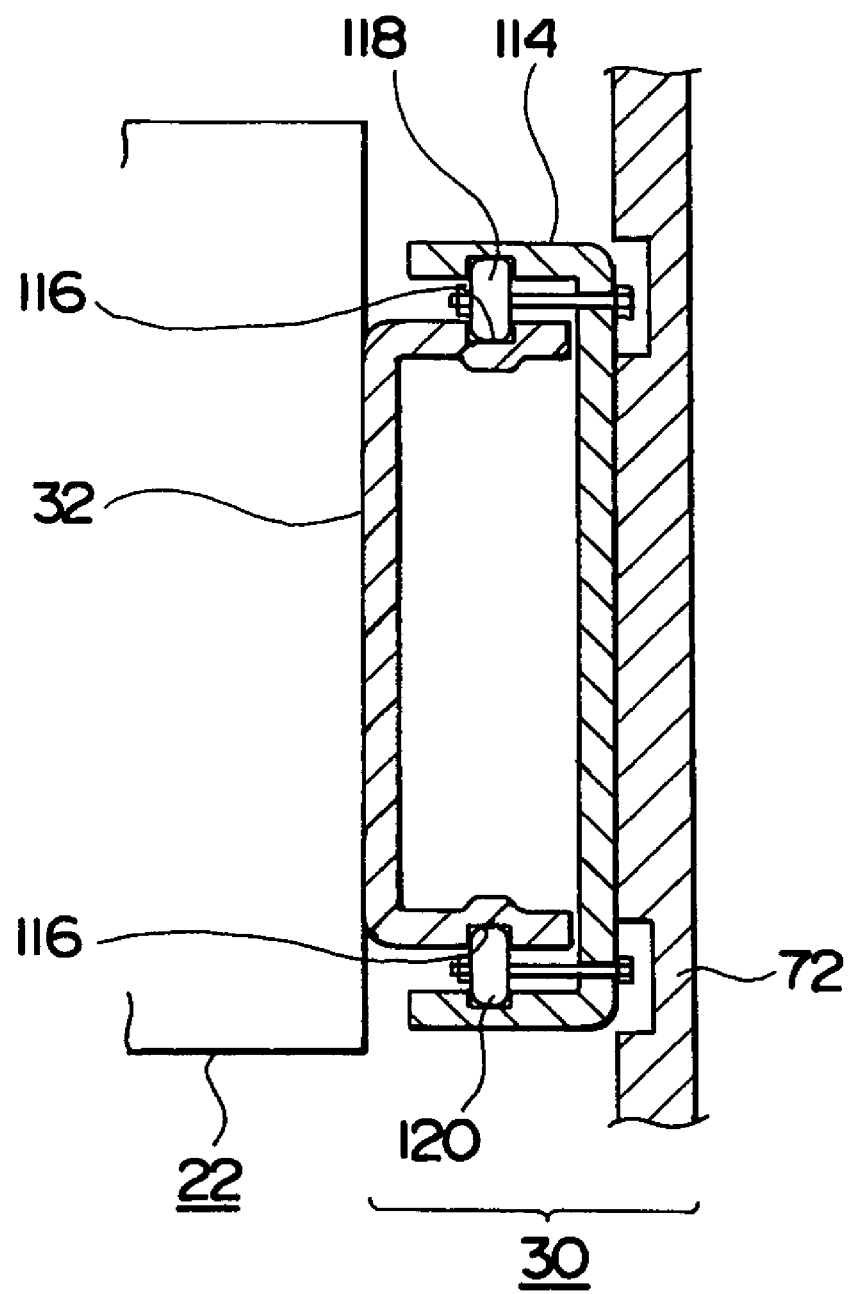
FIG. 14 is a sectional view showing an example of a sliding mechanism.

Description will be given next of the sliding mechanism 30 with reference to FIG. 14. FIG. 14 shows an example of the sliding mechanism 30.

In the sliding mechanism 30, since the slide rail 32 attached to the enclosure 22 is made of a channel material having a C-shaped cross section, there is attached to the side of the rack 72, a guide rail portion 114 corresponding with the slide rail 32. In the guide rail portion 114, there are attached rollers 118 and 120, that correspond with groove portions 116 formed at upper and lower portions of the slide rail 32, so as to be rotationally movable by supporting shafts 122. In such a configuration, the slide rail 32 and the guide rail portion 114 come in contact with each other via the rollers 118 and 120, thus allowing smooth sliding of the enclosure 22 on the rack 72.

Description will be made of other embodiments.

(1). While in the above embodiment, description was made taking the disk array apparatus 20 as an example, the present invention is applicable to electronic equipment equipped with a plurality of apparatus units and is not limited to the disk array apparatus 20.

(2) While description was made of the fixing mechanism 84 configured using a U-shaped spring material, the fixing mechanism 84 may be alternatively configured using a material other than a spring material so long as the fixing mechanism 84 can restrict the movable frame portion 82 within the enclosure 22, and so the fixing mechanism 84 is not limited to a configuration using a spring material.

While the most preferred embodiments of the present invention have been described hereinabove, the present invention is not limited to the above embodiments, and it is a matter of course that various variations and modifications can be made by those skilled in the art within the scope of the claims without departing from the spirit of the invention disclosed herein, and needless to say, the variations and modifications are also included in the scope of the present invention.

The entire disclosure of Japanese Patent Application No. 2004-145299 including specification, claims, drawings and summary are incorporated herein by reference in its entirety.

What is claimed is:

1. An enclosure structure of electronic equipment having an enclosure mounted in a rack in a withdrawable manner, the enclosure structure comprising:

a plurality of wiring panel portions that partition the inner space of the enclosure in a fore-and-aft direction, the plurality of wiring panel portions being disposed spanning over inner surface portions of the enclosure;

a movable frame portion to which a force in a direction of rotational motion is imparted when a lock with the enclosure is unlocked, whereby the movable frame portion moves rotationally so as to rotationally move apparatus units connected to the wiring panel portions together with the wiring panel portions, the movable frame portion providing a support to the apparatus units in such a manner as to be attachable to and detachable from the wiring panel portions;

a rotational motion mechanism as a mechanism imparting the force in the direction of rotational motion to the movable frame portion, the rotational motion mechanism supporting the movable frame portion on the enclosure in such a manner as to be rotationally movable, the rotational motion mechanism rotationally moving the movable frame portion by a given angle.

2. An enclosure structure of electronic equipment having an enclosure mounted in a rack in a withdrawable manner, the enclosure structure comprising:

a plurality of wiring panel portions that are disposed in the enclosure;

a movable frame portion that rotationally moves an apparatus unit connected to the wiring panel portion together with the wiring panel portion; and a rotational motion mechanism that rotationally moves the movable frame portion, wherein the rotational motion mechanism includes:

a supporting shaft supporting the movable frame portion on the enclosure in such a manner as to be rotationally movable;

a gear mechanism intervening between the supporting shaft and the enclosure; and a spring intervening between the enclosure and the movable frame portion, the spring imparting a force of rotational motion derived from a restoration force to between the movable frame portion and the enclosure.

3. The enclosure structure of electronic equipment of claim 2, further comprising a fixing mechanism that fixes the movable frame portion to the enclosure against the restoration force of the spring.

4. The enclosure structure of electronic equipment of claim 3, wherein the fixing mechanism includes:

a locking portion disposed in the movable frame portion, the locking portion blocking rotational motion by becoming caught on a member of the enclosure; and an expansion/contraction portion permitting rotational motion of the movable frame portion by unlocking the locking portion.

5. A disk array apparatus mounted with hard disk units in an enclosure disposed in a rack in such a manner as to be withdrawable, the disk array apparatus comprising:

a plurality of wiring panel portions that partition the inner space of the enclosure in a fore-and-aft direction, the plurality of wiring panel portions being disposed spanning over the inner surface portions of the enclosure;

a movable frame portion to which a force in a direction of rotational motion is imparted when a lock with the enclosure is unlocked, whereby the movable frame portion moves rotationally so as to rotationally move hard disk units connected to the wiring panel portions together with the wiring panel portions, the movable frame portion providing a support to the hard disk units in such a manner as to be attachable to and detachable from the wiring panel portions;

a rotational motion mechanism as a mechanism imparting the force in the direction of rotational motion to the movable frame portion, the rotational motion mechanism supporting the movable frame portion on the enclosure in such a manner as to be rotationally movable, the rotational motion mechanism rotationally moving the movable frame portion by a given angle.

6. A disk array apparatus mounted with hard disk units in an enclosure disposed in a rack in such a manner as to be withdrawable, the disk array apparatus comprising:
   a plurality of wiring panel portions that are disposed in the enclosure;
   a movable frame portion that rotationally moves the hard disk unit connected to the wiring panel portion together with the wiring panel portion; and
   a rotational motion mechanism that rotationally moves the movable frame portion,
   wherein the rotational motion mechanism includes:
   a supporting shaft supporting the movable frame portion on the enclosure in such a manner as to be rotationally movable;
   a gear mechanism intervening between the supporting shaft and the enclosure; and
   a spring intervening between the enclosure and the movable frame portion, the spring imparting a force of rotational motion derived from a restoration force to between the movable frame portion and the enclosure.

7. The disk array apparatus of claim 6, further comprising a fixing mechanism that fixes the movable frame portion to the enclosure against the restoration force of the spring.

8. The disk array apparatus of claim 7, wherein the fixing mechanism includes:
   a locking portion disposed in the movable frame portion, the locking portion blocking rotational motion by becoming caught on a member of the enclosure; and
   an expansion/contraction portion permitting rotational motion of the movable frame portion by unlocking the locking portion.

* * * * *